(12) United States Patent
Park

(10) Patent No.: US 7,776,632 B2
(45) Date of Patent: Aug. 17, 2010

(54) METHOD FOR MANUFACTURING A CMOS IMAGE SENSOR DEVICE

(75) Inventor: Seung-Ryong Park, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 20 days.

(21) Appl. No.: 12/175,750

(22) Filed: Jul. 18, 2008

(65) Prior Publication Data

US 2009/0102000 A1    Apr. 23, 2009

(30) Foreign Application Priority Data

Oct. 22, 2007   (KR) .................. 10-2007-0105937

(51) Int. Cl.
  *H01L 21/00*  (2006.01)
(52) U.S. Cl. ............... 438/29; 438/48; 438/706; 438/725; 257/E31.127
(58) Field of Classification Search ........... 438/29, 438/57, 48, 725, 706; 257/E31.127
  See application file for complete search history.

(56) References Cited

U.S. PATENT DOCUMENTS

| | | | | |
|---|---|---|---|---|
| 6,411,439 B2 * | 6/2002 | Nishikawa | .............. | 359/619 |
| 6,730,459 B2 * | 5/2004 | Nishikawa et al. | .......... | 430/321 |
| 2002/0141067 A1 * | 10/2002 | Takakuwa et al. | ............ | 359/619 |
| 2006/0076697 A1 * | 4/2006 | Lee et al. | ................... | 264/1.21 |

FOREIGN PATENT DOCUMENTS

| KR | 1998-039148 | 8/1998 |
|---|---|---|
| KR | 10-2004-0000877 | 1/2004 |

* cited by examiner

*Primary Examiner*—Thanh Nguyen
(74) *Attorney, Agent, or Firm*—Sherr & Vaughn, PLLC

(57) ABSTRACT

A method for forming a CMOS image sensor (CIS) in accordance with embodiments includes sequentially forming a first photoresist and a blocking layer over a semiconductor substrate where a logic section including a photodiode may be formed. A micro lens array pattern may be formed by coating a second photoresist over top of the formed blocking layer, patterning the second photoresist, and then etching the blocking layer by using the patterned second photoresist as a mask. The first photoresist may be patterned by performing isotropic etching using the micro lens array pattern as a mask. A micro lens array may be formed by filling a material having a refractivity higher than that of the first PR in the patterned portion of the first photoresist. The sensitivity of the CIS can be optimized by maximizing the fill factor while maintaining the spherical surface of the lens by fabricating a micro lens array using anisotropic etching.

11 Claims, 6 Drawing Sheets

METHOD FOR MANUFACTURING A CMOS IMAGE SENSOR DEVICE

The present application claims priority under 35 U.S.C. 119 to Korean Patent Application No. 10-2007-0105937 (filed on Oct. 22, 2007), which is hereby incorporated by reference in its entirety.

BACKGROUND

An image sensor is a device that converts one or two dimensional optical information into an electric signal. Image sensors may be classified into two types: image pickup tubes and a solid image pickup devices. The image pickup tube is widely used in fields related to measurement, control and recognition with adaptation of an image processing technology focused on television. Various applied technologies based on the image pickup tube have been developed.

Image sensors may be further classified into two different types: a metal oxide semiconductor (MOS) type and a charge coupled device (CCD) type. A CMOS image sensor converts an optical image into an electric signal using a device made with CMOS fabrication technology. The CMOS image sensor uses a switching mode that sequentially detects outputs of a MOS transistors for each pixel. Compared to a CCD image sensor, the CMOS image sensor has a more convenient driving mode and is capable of realizing various scanning types. Also, the integration of a signal processing circuit into a single chip makes it possible to miniaturize the CMOS image sensor. Furthermore, the CMOS image sensor helps lower power consumption and reduces manufacturing costs by using a widely compatible CMOS technology.

To increase the sensitivity of such a CMOS image sensor (which may be referred to as a CIS) a micro lens array (MLA) may be used. In the fabrication the MLA, the aberration and area ratio (typically, referred to as a 'fill factor') of the lens are relatively important. In the fabrication of an MLA, a thermal reflow method may be used. To improve sensitivity, a method for increasing a 'fill factor' is proposed.

In the fabrication of an MLA in the related technology as described above, for example, as shown in FIG. 1a, a spherical lens array may be fabricated using a circular mask. In this fabrication, the fill factor is 0.79, which is insufficient to improve the sensitivity of a CIS. To overcome this insufficiency, as shown in FIG. 1b, the fill factor can be increased to some degree compared to a spherical lens array by fabricating an MLA using a rectangular mask. The exterior shape of the lens is made rectangular to increase the fill factor. However, this creates a problem with aberration generated in the plane of the lens. That is to say, the lens is out of focus.

SUMMARY

Embodiments relate to a CMOS image sensor (hereinafter, CIS) device and its formation method, and more particularly, to a device, which can improve the sensitivity of a CIS by isotropically etching the top of a logic section including a photodiode, and its formation method.

Embodiments relate to a CIS device, which can improve the sensitivity of the CIS by maximizing the fill factor while maintaining the shape of the lens to have a spherical surface by manufacturing an MLA by isotropic etching, and its formation method.

A method for forming a CIS in accordance with embodiments includes sequentially forming a first photoresist and a blocking layer over a semiconductor substrate where a logic section including a photodiode may be formed. A micro lens array pattern may be formed by coating a second photoresist over top of the formed blocking layer, patterning the second photoresist, and then etching the blocking layer by using the patterned second photoresist as a mask. The first photoresist may be patterned by performing isotropic etching using the micro lens array pattern as a mask. A micro lens array may be formed by filling a material having a refractivity higher than that of the first PR in the patterned portion of the first photoresist.

The isotropic etching may be performed by wet etching or a CDE method. In the CDE method, the PR may be etched by use of a $CH_xF_y$ gas by using the MLA pattern as a blocking layer under conditions of a vacuum depth set within the range of 300 to 500 mT and a time period set within the range of 4 to 6 minutes. The material with a higher refractivity may be a novolac PR. The blocking layer may be an oxide film or a silicon nitride film $Si_3N_4$. A method of etching the blocking layer is performed by PEP (Photo Etching Process).

Additionally, a CIS device in accordance with embodiments includes a logic section including a photodiode. A photoresist layer is over the top of the logic section, with a portion of the top part thereof being isotropically etched. A micro lens array may be formed by filling a material having a refractivity higher than that of the photoresist layer in the isotropically etched portion of the photoresist layer. The isotropically etched portion has a downward convex shape.

Embodiments can improve semiconductor yield because the sensitivity of the CIS can be optimized by maximizing the fill factor while maintaining the shape of the lens to have a spherical surface by manufacturing an MLA by isotropic etching, and its formation method.

DRAWINGS

Figure 1A:
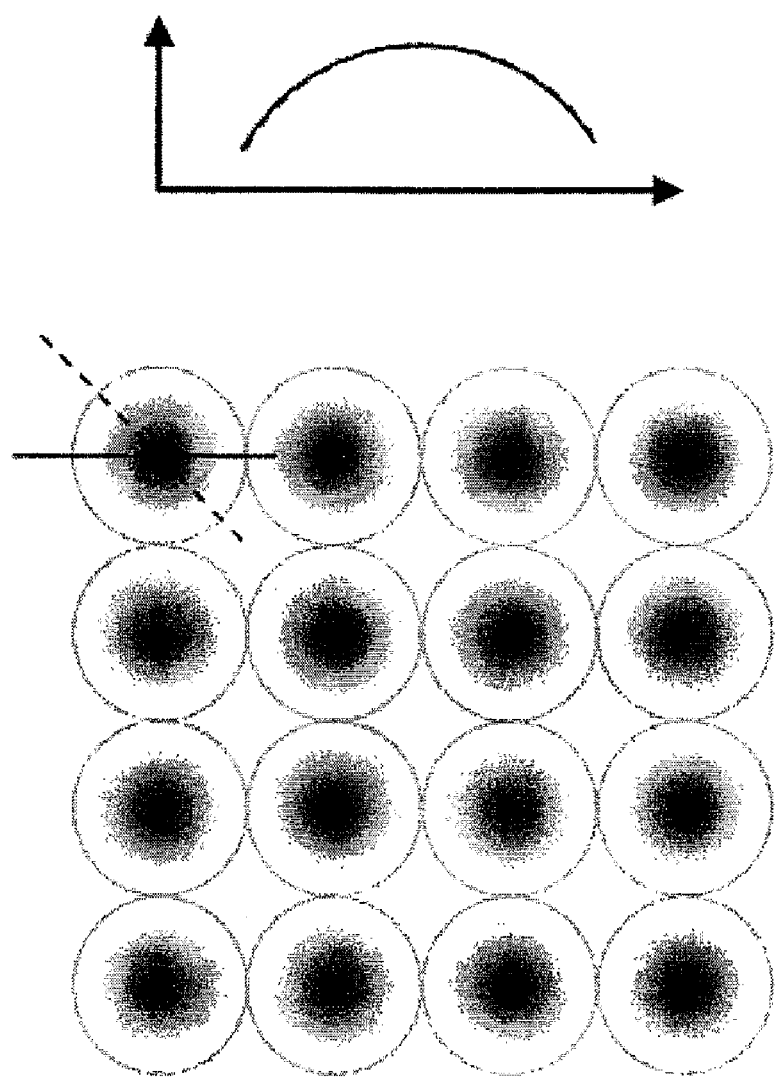
FIG. 1a is a view of a lens array fabricated using a circular mask.
Figure 1B:
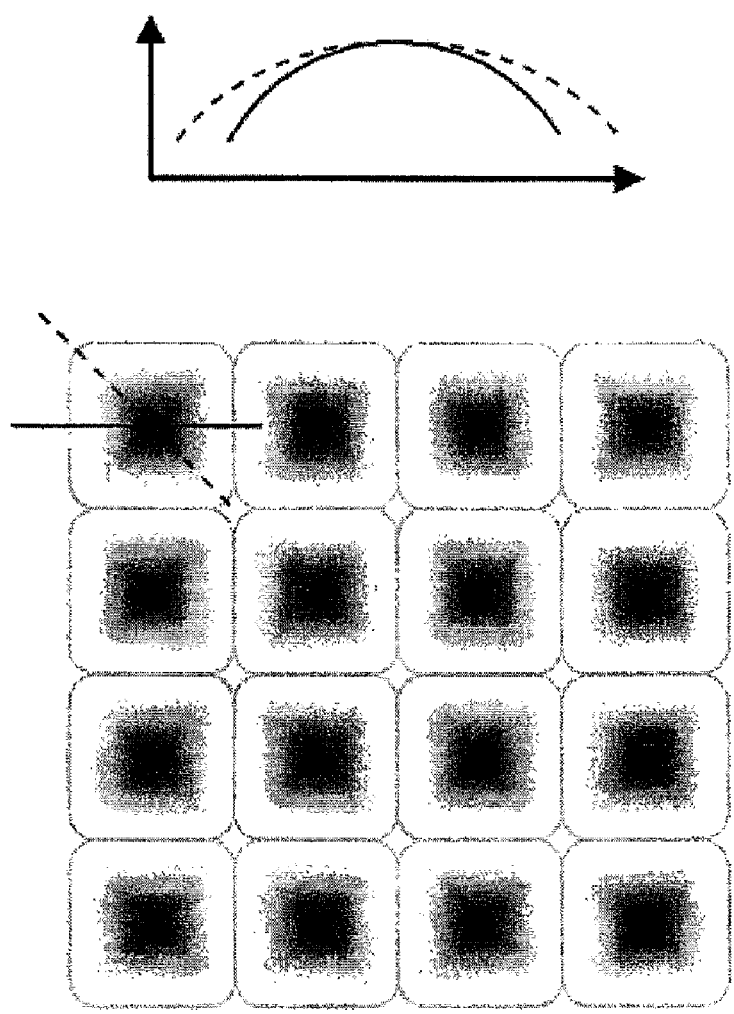
FIG. 1b is a view of a lens array fabricated using a rectangular mask.
Figure 2:
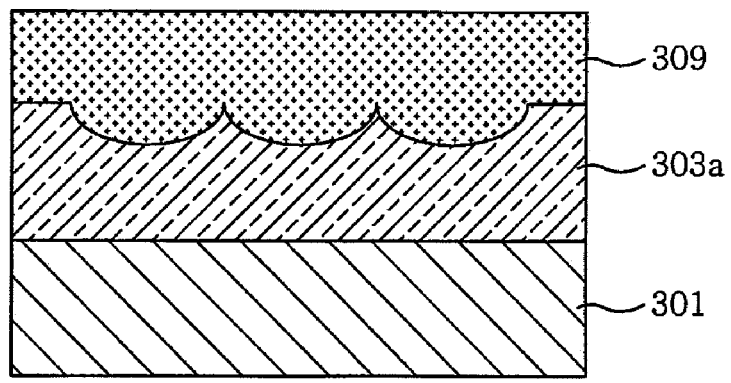

Example FIG. 2 is a view showing an MLA structure of a semiconductor device according to embodiments.

Example FIGS. 3a to 3f are cross sectional views illustrating a method for fabricating a semiconductor device for an MLA in accordance with embodiments.

Figure 4:
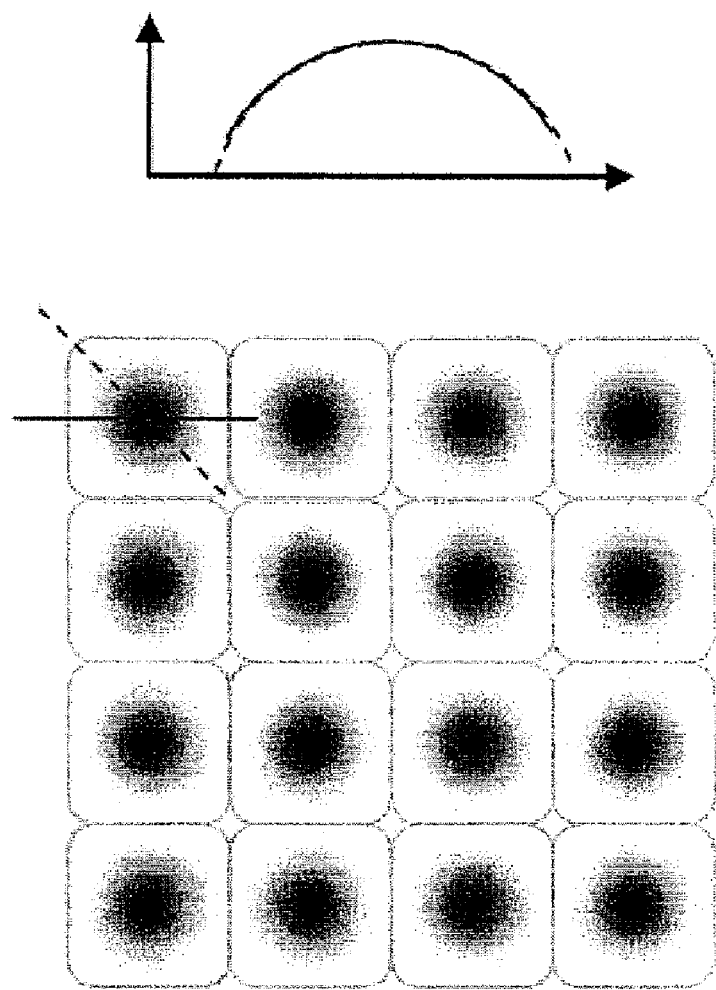

Example FIG. 4 is a view of a lens array fabricated with lenses having a spherical surface.

DESCRIPTION

Example FIG. 2 is a view showing a structure of a CIS device according to embodiments. A photoresist (hereinafter, PR) is coated over the entire surface of the top of a logic section 301 which includes a photodiode over a semiconductor substrate. Afterwards, a blocking layer and a PR pattern for forming an MLA pattern are sequentially formed over the entire surface of the top portion of the PR. An MLA pattern is formed by selectively removing the blocking layer deposited over the entire surface by performing an etching process. The PR pattern is used as a mask, and then an MLA PR pattern 303a is formed by performing isotropic etching, using the MLA pattern as a mask.

Next, an MLA with a concave structure can be fabricated by filling a material 309 in the entire surface of the top portion of the MLA PR pattern 303a and performing a planarization process. Material 309 has a refractivity $n_2$ which is higher than the refractivity of the MLA PR pattern 303a.

Example FIGS. 3a to 3f are cross sectional views illustrating a method for fabricating a semiconductor device for an MLA in accordance with embodiments. Referring to example FIG. 3a, a logic section 301, which includes a photodiode, may be formed over a semiconductor substrate by a related semiconductor process. A PR 303 may be coated over the entire surface of the top part of the logic section 301. Here, the logic section serves to process a received light into an electrical signal.

Figure 3A:
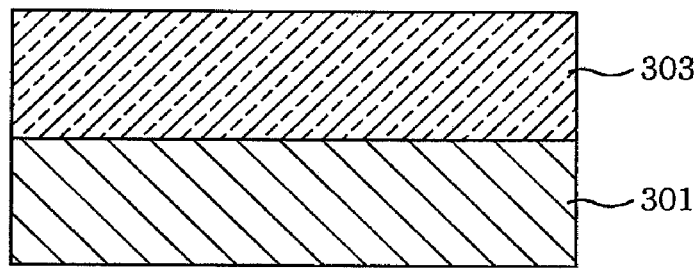
Figure 3B:
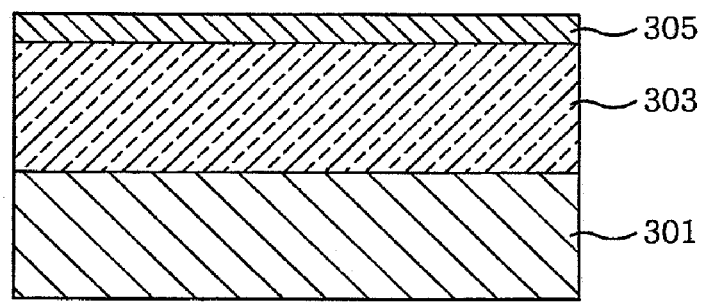

Next, as shown in example FIG. 3b, a blocking layer 305 may be formed over the entire surface of the top portion of the coated PR 303. The blocking layer may be formed of an oxide film or a silicon nitride film $Si_3N_4$.

Figure 3C:
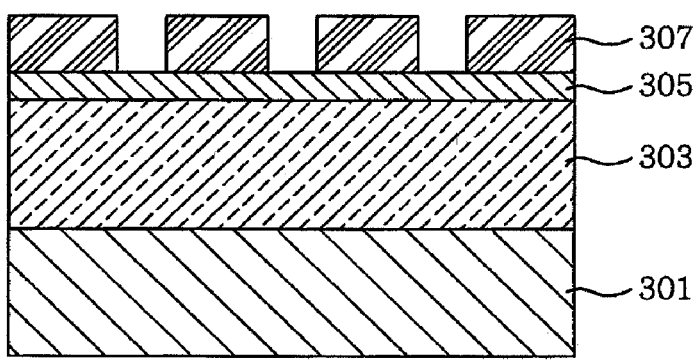

Thereafter, as shown in example FIG. 3c, a PR pattern 307 for forming an MLA pattern is formed. A PR is coated over the entire surface of the top portion of the blocking layer 305. Portions of the top PR are selectively removed by performing an exposure process, using a recticle designed with the intended pattern, and a development process.

Figure 3D:
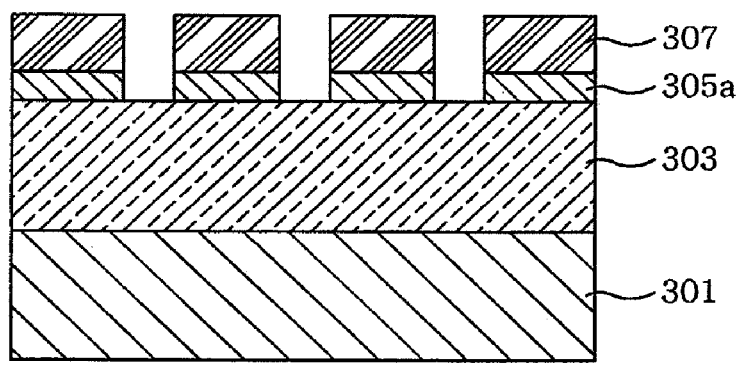

As shown in example FIG. 3d, an MLA pattern 305a may be formed by selectively removing the blocking layer 305 deposited over the entire surface. An etching process (e.g., a photo etching process, hereinafter, PEP), may be performed, using the PR pattern 307 formed as above as a mask. The remaining PR pattern 307 may be removed by performing a stripping process.

Figure 3E:
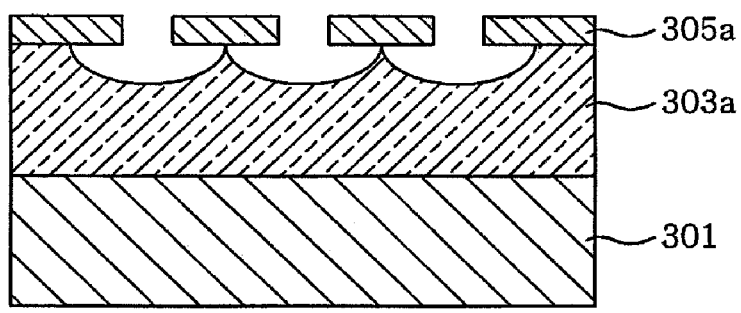

Next, as shown in example FIG. 3E, an MLA PR pattern 303a may be formed by performing isotropic etching, using the MLA pattern 305a as a mask. Here, the isotropic etching may be a wet etching or a chemical downstream etching (hereinafter, CDE). In case of the CDE, the PR 303 may be etched by use of a $CH_xF_y$ gas, using the MLA pattern 305a as a blocking layer, under conditions of a vacuum set to a relatively high level, i.e., within the range of 300 to 500 mT, and a time period set within the range of 4 to 6 minutes.

Figure 3F:
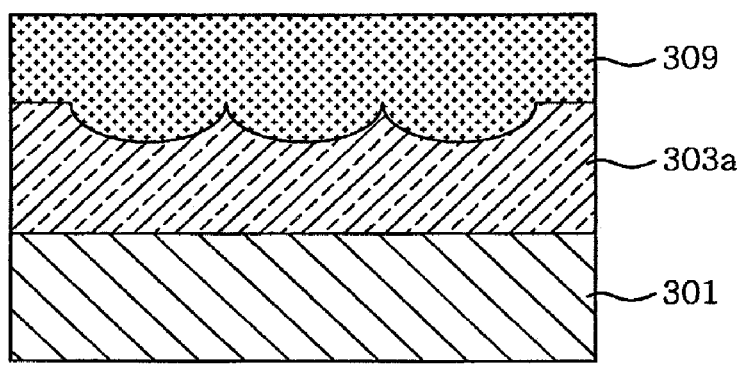

Finally, after removal of the MLA pattern 305a, as shown in example FIG. 3f, an MLA having a concave shape can be fabricated by filling a material 309 having a higher refractivity $n_2$ than the refractivity $n_1$ of the MLA PR pattern 303a in the entire surface of the top portion of the formed MLA PR pattern 303a, and performing a planarization process. Here, the material 309 having a higher refractivity $n_2$ may be a novolac PR.

As explained above, as shown in example FIG. 4, embodiments can improve semiconductor yield because the sensitivity of the CIS can be optimized by maximizing the fill factor while maintaining the spherical shape of the lens by manufacturing an MLA through isotropic etching.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   sequentially forming a first photoresist and a blocking layer over a semiconductor substrate where a logic section is formed;
   forming a micro lens array pattern by coating a second photoresist over the top of the formed blocking layer, patterning the second photoresist, and then etching the blocking layer using the patterned second photoresist as a mask;
   patterning the first photoresist by performing isotropic etching using the micro lens array pattern as a mask; and
   forming an micro lens array by filling a material having a refractivity higher than that of the first photoresist in the patterned portion of the first photoresist.

2. The method of claim 1, wherein the isotropic etching is performed by a wet etching method.

3. The method of claim 1, wherein the isotropic etching is performed by a chemical downstream etching method.

4. The method of claim 3, wherein the chemical downstream etching includes etching the first photoresist by a $CH_xF_y$ gas using the micro lens array pattern as a blocking layer.

5. The method of claim 3, wherein the chemical downstream etching is performed with a vacuum set within the range of 300 to 500 mT.

6. The method of claim 3, wherein the chemical downstream etching is performed for a time period set within the range of 4 to 6 minutes.

7. The method of claim 1, wherein the material having a higher refractivity includes a novolac photoresist.

8. The method of claim 1, wherein the blocking layer is an oxide film.

9. The method of claim 1, wherein the blocking layer is a silicon nitride film $Si_3N_4$.

10. The method of claim 1, wherein etching the blocking layer is performed by a photo etching process.

11. The method of claim 1, wherein the logic section includes a photodiode.

* * * * *